(12) United States Patent
Barnak et al.

(10) Patent No.: US 7,022,559 B2
(45) Date of Patent: Apr. 4, 2006

(54) MOSFET GATE ELECTRODES HAVING PERFORMANCE TUNED WORK FUNCTIONS AND METHODS OF MAKING SAME

(75) Inventors: John P. Barnak, Banks, OR (US); Robert S. Chau, Beaverton, OR (US); Chunlin Liang, San Jose, CA (US)

(73) Assignee: Intel Corporation, Santa Clara, CA (US)

( * ) Notice: Subject to any disclaimer, the term of this patent is extended or adjusted under 35 U.S.C. 154(b) by 32 days.

(21) Appl. No.: 10/301,285

(22) Filed: Nov. 20, 2002

(65) Prior Publication Data

US 2003/0146479 A1 Aug. 7, 2003

Related U.S. Application Data

(62) Division of application No. 09/165,009, filed on Sep. 30, 1998, now abandoned.

(51) Int. Cl.
*H01L 21/00* (2006.01)

(52) U.S. Cl. .............. 438/153; 438/199; 438/275; 438/775; 257/412

(58) Field of Classification Search ........ 438/153–154, 438/199, 275–276, 301, 585–587, 775–7, 438/777; 257/412
See application file for complete search history.

(56) References Cited

U.S. PATENT DOCUMENTS

| | | | | |
|---|---|---|---|---|
| 3,855,610 A | * | 12/1974 | Masuda et al. | 357/23 |
| 4,561,170 A | * | 12/1985 | Doering et al. | 29/571 |
| 4,696,092 A | * | 9/1987 | Doering et al. | 438/210 |
| 4,892,835 A | * | 1/1990 | Rabinzohn et al. | 438/184 |
| 5,021,356 A | * | 6/1991 | Henderson et al. | 438/294 |
| 5,061,647 A | * | 10/1991 | Roth et al. | 438/304 |
| 5,223,455 A | * | 6/1993 | Itoh et al. | 438/656 |
| 5,240,868 A | * | 8/1993 | Bae et al. | 438/591 |
| 5,523,257 A | * | 6/1996 | Yamazaki et al. | 438/166 |
| 5,555,112 A | * | 9/1996 | Oritsuki et al. | 359/59 |
| 5,619,057 A | * | 4/1997 | Komatsu | 257/382 |
| 5,627,084 A | * | 5/1997 | Yamazaki et al. | 438/166 |
| 5,736,750 A | * | 4/1998 | Yamazaki et al. | 257/59 |
| 5,736,767 A | * | 4/1998 | Yoshitomi et al. | 257/344 |
| 5,891,766 A | * | 4/1999 | Yamazaki et al. | 438/163 |

(Continued)

FOREIGN PATENT DOCUMENTS

JP 90-158171 * 2/1990

(Continued)

OTHER PUBLICATIONS

S. Wolf, "Silicon Processing for the VLSI Era", vol. 2, 1990, Lattice Press, CA, USA.*

(Continued)

*Primary Examiner*—Hoai Pham
*Assistant Examiner*—Ginette Peralta
(74) *Attorney, Agent, or Firm*—Blakely, Sokoloff, Taylor & Zafman LLP

(57) ABSTRACT

An insulated gate field effect transistor (FET) of a particular conductivity type, has as a gate electrode, a non-semiconductive material with a work function that approximates the work function of a semiconductive material that is doped to be of the same conductivity type.

In a particular embodiment, an integrated circuit includes an n-channel FET having a tantalum-based gate electrode with a work function approximately the same as n-doped polysilicon, and a p-channel FET has a tantalum nitride-based gate electrode with a work function approximately the same as p-doped polysilicon.

22 Claims, 4 Drawing Sheets

U.S. PATENT DOCUMENTS

| | | | | |
|---|---|---|---|---|
| 5,939,731 A | * | 8/1999 | Yamazaki et al. | 257/59 |
| 5,948,702 A | * | 9/1999 | Rotondaro | 438/707 |
| 5,985,762 A | * | 11/1999 | Geffken et al. | 438/687 |
| 5,986,314 A | * | 11/1999 | Seshadri et al. | 257/402 |
| 5,995,177 A | * | 11/1999 | Fujikawa et al. | 349/46 |
| 6,027,961 A | * | 2/2000 | Maiti et al. | 438/199 |
| 6,066,533 A | * | 5/2000 | Yu | 438/275 |
| 6,166,417 A | * | 12/2000 | Bai et al. | 257/407 |
| 6,225,168 B1 | * | 5/2001 | Gardner et al. | 438/287 |

FOREIGN PATENT DOCUMENTS

| | | |
|---|---|---|
| JP | 02-158117 | 6/1990 |

OTHER PUBLICATIONS

Sze, "Physics of Semiconductor Devices", 2nd Ed., 1981, J. Wiley & Sons, Taiwan ROC.*

Wolf, S. "Silicon Processing for the VLSI Era", Col. 3, 1990, 3 pages, Lattice Press, CA USA.

Sze, "Physics of Semiconductor Devices", $2^{nd}$ Ed., 1981, 12 pages, J. Wiley & Sons, Taiwan ROC.

Kazuhide, I., et al., "Ion energy, ion flux, and ion species effects on crystallographic sand electrical properties of sputter-deposited Ta thin films", Journal of Vacuum Science & Technology A, 5 pages, Second Series, vol. 15, No. 5, Sep./Oct. 1997.

* cited by examiner

MOSFET GATE ELECTRODES HAVING PERFORMANCE TUNED WORK FUNCTIONS AND METHODS OF MAKING SAME

This application is divisional of U.S. patent application Ser. No. 09/165,009, filed Sep. 30, 1998 now abandoned.

BACKGROUND OF THE INVENTION

1. Field of the Invention

The present invention relates generally to semiconductor structures and manufacturing. More particularly the invention relates to the formation of gate electrodes for metal-oxide-semiconductor field effect transistors (MOSFETs).

2. Background

Advances in semiconductor manufacturing technology have led to the integration of millions of circuit elements, such as transistors, on a single integrated circuit (IC). Not only have interconnect line widths become smaller, but so have the dimensions of metal-oxide-semiconductor field effect transistors (MOSFETs).

MOSFETs are also sometimes referred to as insulated gate field effect transistors (IGFETs). Most commonly, theses devices are referred to simply as FETs, and are so referred to in this disclosure.

Transistor scaling typically involves more than just the linear reduction of the FET width and length. For example, both source/drain (S/D) junction depth and gate insulator thickness are also typically reduced in order to produce a FET with the desired electrical characteristics.

As is well-known, the gate electrode of a FET is commonly formed from a patterned layer of polycrystalline silicon. Polycrystalline silicon is also referred to polysilicon. The polysilicon gate electrodes are commonly doped such that the gate electrodes of n-channel FETs (NFETs) are n-type, and the gate electrodes of p-channel FETs (PFETs) are p-type. The doping of the polysilicon gate electrode affects its work function. The work function in turn affects the threshold voltage of the FET.

Since doped polysilicon is a semiconductive material, it tends to experience the formation of a depletion region adjacent to the interface between the gate electrode and the gate insulator when a voltage is applied to the gate electrode. As device scaling has substantially reduced the thickness of the gate insulator layer, the width of the depletion region in the doped polysilicon gate electrode has come to play a more significant role in determining the electrical characteristics of the FET. Unfortunately, the occurrence of this depletion region in the gate electrode tends to degrade transistor performance.

What is needed is a gate electrode that provides approximately the same work function values as doped polysilicon while substantially avoiding the effects of depletion region formation.

SUMMARY OF THE INVENTION

Briefly, a FET of a particular conductivity type, has as a gate electrode, a non-semiconductive material with a work function that approximates the work function of a semiconductive material that is doped to be of the same conductivity type.

In a particular embodiment, an n-channel FET has a tantalum-based gate electrode with a work function approximately the same as n-doped polysilicon, and a p-channel FET has a tantalum nitride-based gate electrode with a work function approximately the same as p-doped polysilicon.

DETAILED DESCRIPTION

Terminology

Figure 1:
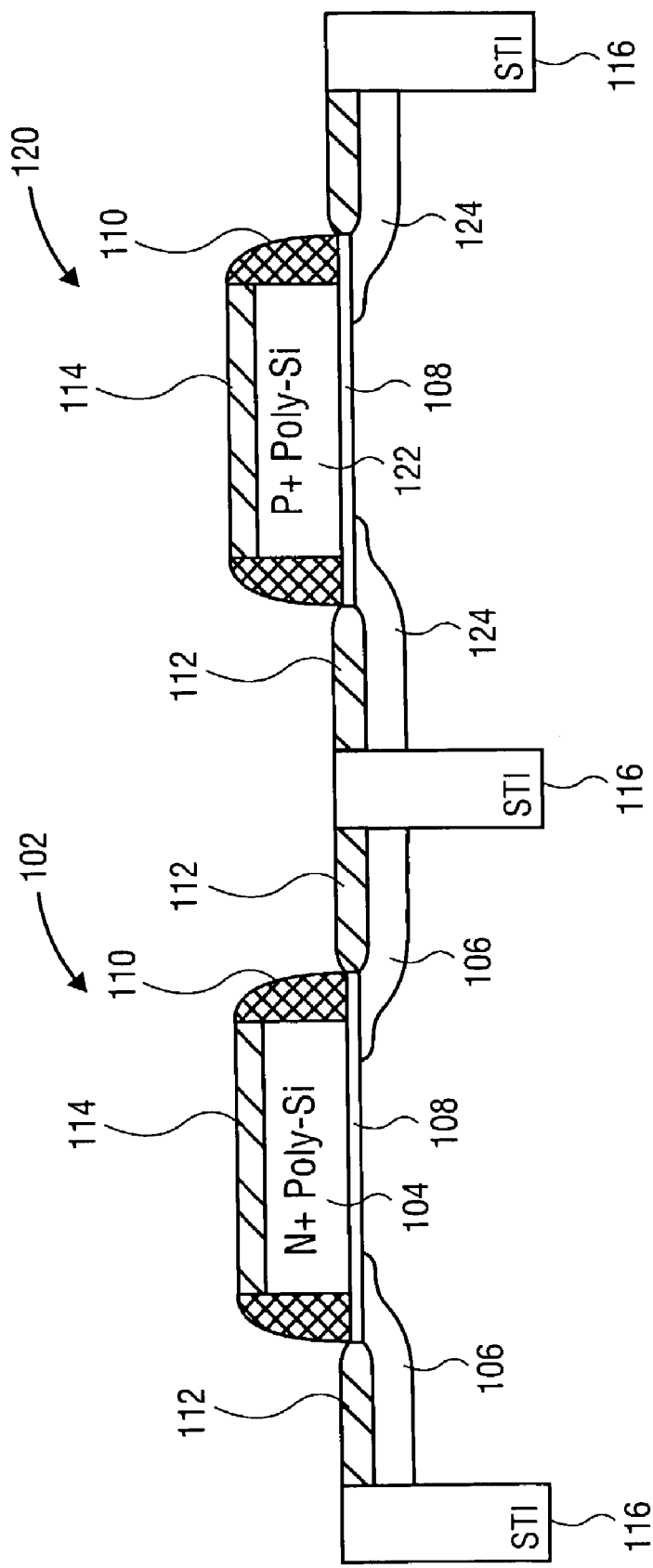
FIG. 1 is a schematic cross-sectional view of a complementary pair of conventional MOSFETs having gate electrodes formed of polysilicon.

The terms, chip, integrated circuit, monolithic device, semiconductor device, and microelectronic device, are often used interchangeably in this field. The present invention is applicable to all the above as they are generally understood in the field.

Historically, the material most commonly used in the semiconductor industry to form the gate insulator layer of a FET is silicon dioxide. Thus the gate insulator layer is frequently referred to simply as the gate oxide. The expression gate dielectric is also used to describe the gate insulator layer.

The term "gate" is context sensitive and can be used in two ways when describing integrated circuits. Gate refers to a circuit for realizing an arbitrary logical function when used in the context of a logic gate. However, as used herein, gate refers to the insulated gate terminal of a three terminal FET when used in the context of transistor circuit configurations or formation of transistor structures. The expression "gate terminal" is generally interchangeable with the expression "gate electrode". A FET can be viewed as a four terminal device when the semiconductor body is considered, for the purpose of describing illustrative embodiments of the present invention, the FET will be described using the traditional gate-drain-source, three terminal model.

Polycrystalline silicon is a nonporous form of silicon made up of randomly oriented crystallites or domains. Polycrystalline silicon is often formed by chemical vapor deposition from a silicon source gas or other methods and has a structure that contains large-angle grain boundaries, twin boundaries, or both. Polycrystalline silicon is often referred to in this field as polysilicon, or sometimes more simply as poly.

Poly depletion effect is an expression that has come to refer to the carrier depletion effect observed in gate electrodes formed from semiconductive materials, such as doped polysilicon.

Source/drain terminals refer to the terminals of a FET, between which conduction occurs under the influence of an electric field, subsequent to the inversion of the semiconductor surface under the influence of a vertical electric field resulting from a voltage applied to the gate terminal. Generally, the source and drain terminals are fabricated such that they are geometrically symmetrical. With geometrically symmetrical source and drain terminals it is common to simply refer to these terminals as source/drain terminals, and this nomenclature is used herein. Designers often designate a particular source/drain terminal to be a "source" or a "drain" on the basis of the voltage to be applied to that terminal when the FET is operated in a circuit.

Overview

In conventional FETs, polysilicon is used as the gate electrode material. The polysilicon is typically doped to be p-type or n-type, using operations such as ion implantation or thermal diffusion. It has been found that FETs exhibit a carrier depletion effect that degrades the device driving current performance. As long as the gate electrode material in contact with the gate dielectric is semiconducting, the carrier depletion effect cannot be eliminated.

An example of the structure of conventional FETs is shown in FIG. 1. Referring to FIG. 1, an NFET 102 includes an n-doped polysilicon gate electrode 104, source/drain regions (also referred to as terminals) 106, and gate insulator 108. The top surface of source/drain regions 106, as well the top surface of gate electrode 104 are silicided to reduce electrical resistance. Sidewall spacers 110 are adjacent to gate electrode 104. Similarly, a PFET 120 includes an n-doped polysilicon gate electrode 122, source/drain regions (also referred to as terminals) 124, and gate insulator 108. The top surface of source/drain regions 124, as well the top surface of gate electrode 122 are silicided to reduce electrical resistance. Sidewall spacers 110 are adjacent to gate electrode 122. FETs 102, 120 are isolated from other devices in an integrated circuit by shallow trench isolation structures 116.

The carrier depletion effect in polysilicon gate electrodes, also referred to as the poly depletion effect, occurs when an applied electric field sweeps away carriers so as to create a region in the doped polysilicon where the non-mobile dopant atoms become ionized. In n-doped polysilicon the depletion layer includes ionized non-mobile donor sites, whereas in p-doped polysilicon the depletion layer includes ionized non-mobile acceptor sites. This depletion effect results in a reduction in the strength of the expected electric field at the surface of the semiconductor when a voltage is applied to the gate electrode. The reduced electric field strength adversely affects transistor performance.

The use of thinner gate insulators, will tend to make the carrier depletion effect on device degradation even worse. With thinner gate oxides, the polysilicon gate depletion layer will become significant in dimension when compared to the gate oxide thickness and therefore reduce device performance. Typical depletion layer width in doped polysilicon gate electrodes is believed to be in the range of approximately 10 to 40 angstroms. This carrier depletion effect in the gate electrode limits device scalability by imposing a lower bound on how much the effective gate insulator thickness of the FET can be reduced. In other words, the depletion layer in the gate electrode effectively moves the gate electrode further from the surface of the semiconductor and therefore makes it more difficult for the applied electric field to create an inversion layer at the surface of the semiconductor.

One term in equations that describe the FET threshold voltage is $\phi_{MS}'$, which represents the work function difference between the semiconductor and the material comprising the gate electrode. Embodiments of the present invention, replace the n-doped and p-doped polysilicon typically found in NFETs and PFETs respectively, with metal gate electrodes designed to have work functions that are close to those of the n-doped and p-doped polysilicon. Metal gate electrodes eliminate the carrier depletion effect observed in doped polysilicon gate electrodes. This in turn allows improved transistor performance. At the same time, by maintaining $\phi_{MS}'$ equal to, or at least close to the value that was contemplated in the development of a manufacturing process that uses polysilicon gates, the metal gate electrodes can be used without having to adjust the doping concentration in the body of the FETs. Those skilled in the art and having the benefit of this disclosure will recognize that the doping concentration in the body has a significant effect on the electrical characteristics of FETs.

A good match of work functions can be obtained by using tantalum (Ta) for the gate electrodes of NFETs and tantalum nitride (TaN$_x$) for the gate electrodes of PFETs. The work function found in n-doped polysilicon is approximately 4.15 eV, and the work function found in Ta is approximately 4.2 eV. Similarly, the work function found in p-doped polysilicon is approximately 5.27 eV, and the work function found in TaN$_x$ is approximately 5.4 eV.

Illustrative Structure

Figure 2:
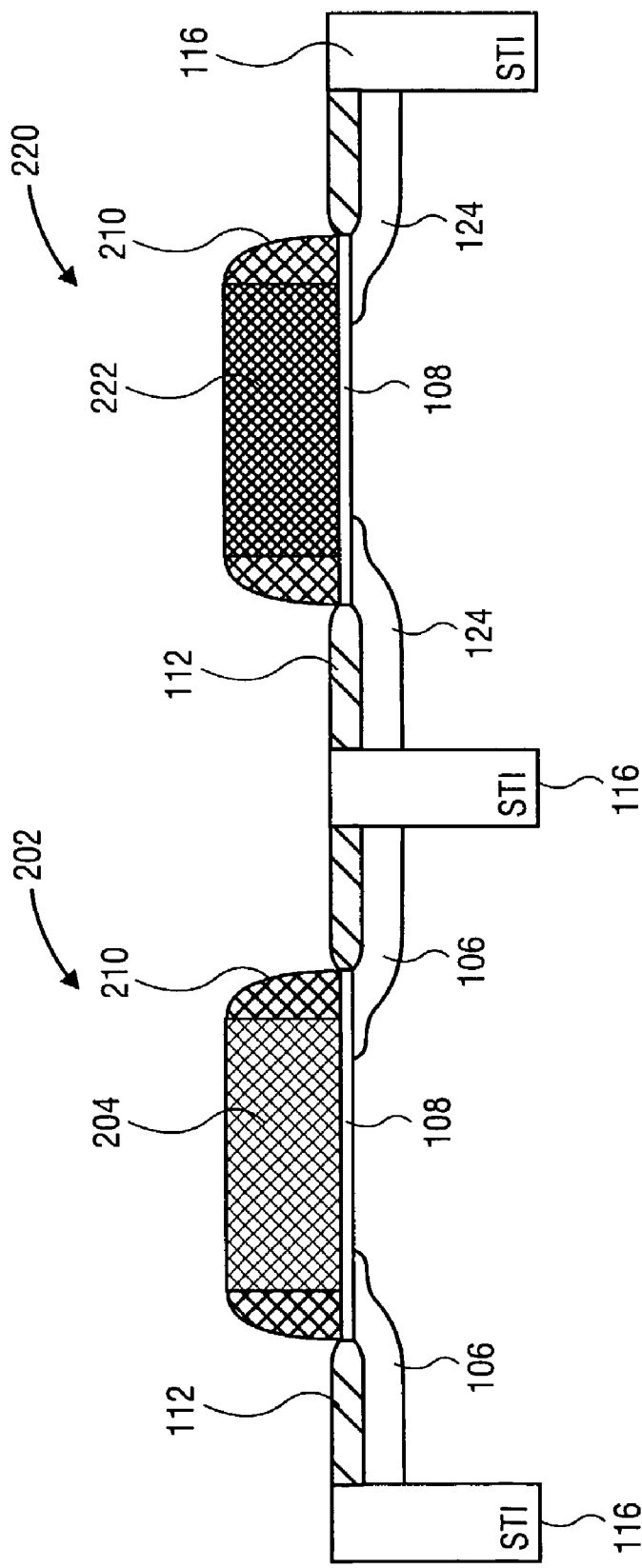
FIG. 2 is a schematic cross-sectional view of a pair of MOSFETs having tantalum and tantalum nitride gate electrodes in accordance with the present invention.

MOSFET gate electrodes having performance tuned work functions in accordance with the present invention are formed from metals selected so as to closely match the work functions of doped polysilicon. In this way, the poly depletion effect observed in conventional polysilicon gate electrodes is avoided, and no changes, or only small changes, are required to the doping profile of the FET body to maintain the desired MOSFET electrical characteristics. The structure of complementary FETs in accordance with the present invention are shown in FIG. 2. In the illustrative embodiment, an n-channel FET 202 has a tantalum gate electrode 204 and a p-channel FET 220 has a tantalum nitride gate electrode 222. In most other respects, these transistors are similar to conventional FETs. Unlike the conventional FETs shown in FIG. 1, it is not necessary to form a silicided region on the top surface of gate electrodes 204, 222 because the sheet resistivities of tantalum and tantalum nitride are less than the sheet resistivity of doped polysilicon. However, if desired, other low resistivity materials may be deposited superjacent the tantalum and tantalum nitride gate electrodes, to reduce sheet resistance even further. For example, since tantalum is a barrier to copper, copper may used to form a conductive stack with the underlying tantalum or tantalum nitride. Of course, the gate insulator layer should be protected such that stray copper atoms do not penetrate into the substrate. Alternatively, any suitable treatment or process of the tantalum gate electrodes or the tantalum nitride gate electrodes, may be used to reduce their sheet resistivity. For example, an annealing operation or implant operation may reduce the sheet resistivity of the tantalum gate electrodes or the tantalum nitride gate electrodes. It is preferable that any such treatment or process not substantially alter the work function of the gate electrodes.

In an alternative embodiment of the present invention, a barrier layer may be disposed between the gate insulator layer and the gate electrode layer. Such a barrier is typically less than or equal to approximately 5 nm in thickness. By keeping such a barrier layer thin, the work function of the gate electrode will be determined by the overlying, thicker gate electrode material. A barrier layer may comprise a nitrogen containing material such as titanium nitride or tantalum nitride. The atomic percent of nitrogen in the barrier layer material may be in the range of 0% to 65%.

Those skilled in the art and having the benefit of this disclosure will appreciate that the present invention is not limited in use to the structures illustrated in FIG. 2. For example, structural elements including, but not limited to, sidewall spacers, silicided junctions, and shallow isolation trenches, are not requirements of the present invention.

Illustrative Process Flow

Illustrative embodiments of the present invention are described with reference to FIGS. 3–6. To form an integrated circuit containing both NFETs and PFETs in accordance with the present invention, conventional, well-known semiconductor processing operations are performed upon a wafer up through the formation of the gate insulator layer.

Figure 3:
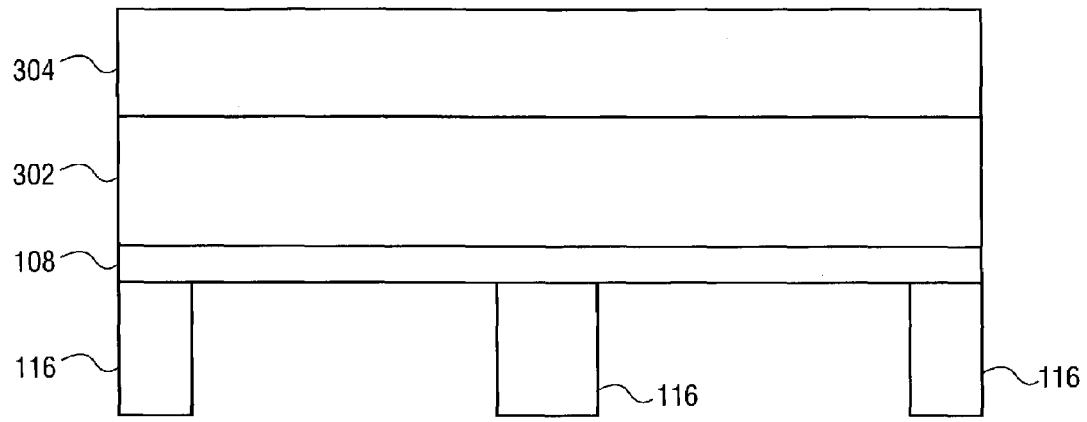
FIG. 3 is a schematic cross-sectional view of a wafer having shallow isolation trenches, a gate insulator, a tantalum film, and a masking layer.

Referring to FIG. 3, an illustrative embodiment is shown wherein, subsequent to the formation of a plurality of isolation trenches 116 and a gate insulator layer 108, a blanket deposition of Ta is performed so as to form a thin film of tantalum 302 over the surface of gate insulator layer 108. The Ta can be deposited by methods including but not limited to, chemical vapor deposition (CVD), physical vapor deposition (PVD), plasma enhanced chemical vapor deposition (PECVD), and molecular beam epitaxy (MBE). The initial thickness of Ta film 302 above gate insulator layer 108 contains from 0 to 65 atomic percent nitrogen or other barrier films which are processed as a separate step or in-situ in the Ta deposition chamber. This layer closest to the gate insulator layer is typically on the order of 5 nm.

As further shown in FIG. 3, a masking layer 304 is deposited on Ta film 302.

Figure 4:
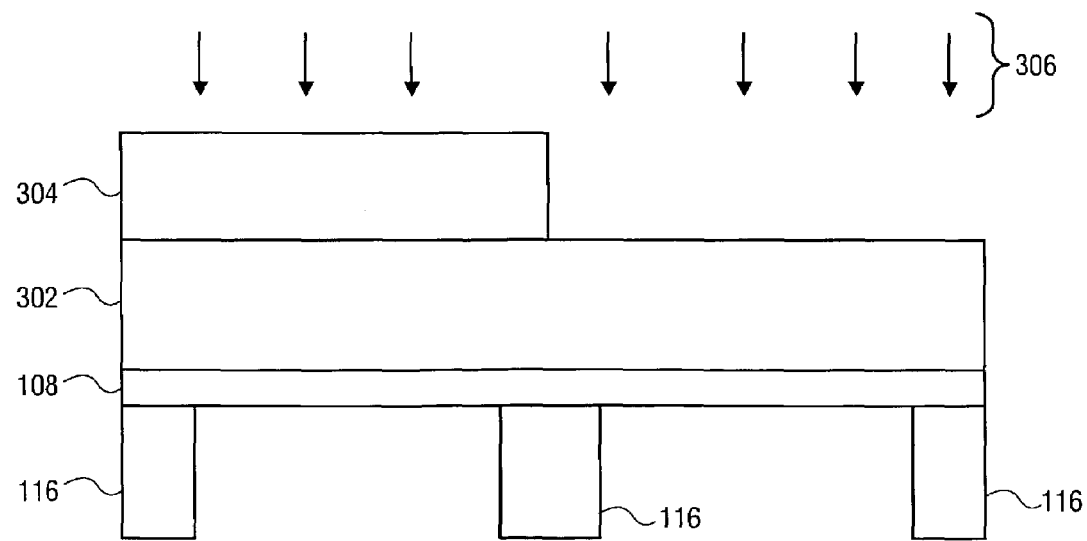
FIG. 4 is a schematic cross-sectional view of the wafer of FIG. 3, wherein the masking layer has been patterned to expose a portion of the tantalum film, and the wafer is subjected to a nitridization process.

Referring now to FIG. 4, masking layer 304 is patterned such that it remains over areas wherein NFETs are to be formed, and is removed, so as to expose the Ta film, in areas wherein PFETs are to be formed.

Still referring FIG. 4, a nitridization operation 306 is performed to convert the exposed Ta to TaNx. Patterned masking layer 304 protects the tantalum underlying it from nitridization operation 306. Nitridization can be achieved using ion implantation, or a high temperature process containing a source of nitrogen for the conversion of Ta to TaNx. Alternatively, a plasma assisted operation may be used to achieve nitridization of the tantalum. For example, a nitrogen containing plasma, including but not limited to ammonia, is ignited so as to incorporate nitrogen into the tantalum. Those skilled in the art will recognize that this may be a remote or a direct plasma, and that a carrier gas such as argon or helium is used. Various details of the plasma reaction such as power, bias, flow rate, and so on, are a function specific process trade-offs, including but not limited to reaction time, controllability, uniformity, and the type of plasma reaction chamber, and are well understood by skilled practitioners in the art.

Figure 5:
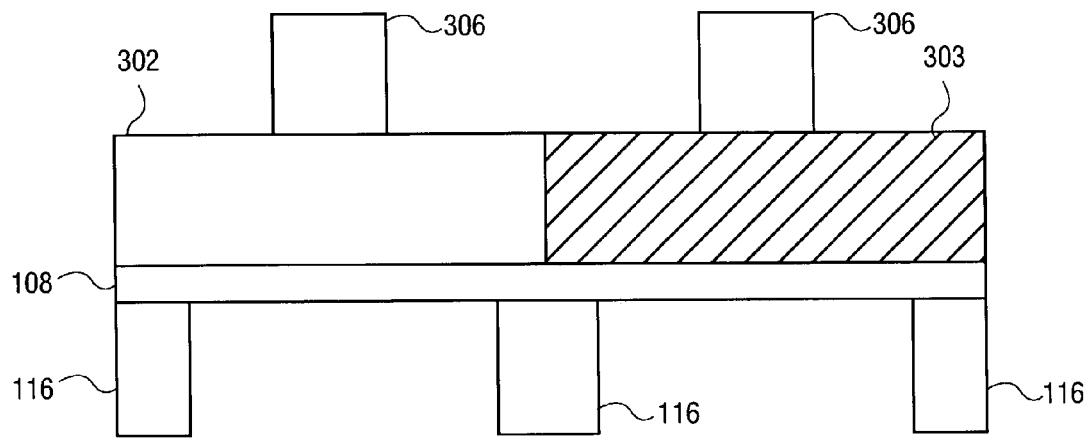
FIG. 5 is a schematic cross-sectional view of the wafer of FIG. 4, wherein the exposed tantalum film has been converted to a tantalum nitride film and a gate mask has been deposited and patterned to expose portions of the tantalum and tantalum nitride.

Referring now to FIG. 5, subsequent to nitridization operation 306, patterned masking layer 304 is removed. The resultant structure is a continuous blanket metal film composed of Ta 302 and TaN$_x$ 303 regions over the NFET and PFET device regions respectively, wherein the Ta and TaN$_x$ regions have dissimilar work functions. More particularly, the Ta has a work function similar to the work function of n-doped polysilicon, and the TaNx has a work function similar to the work function of p-doped polysilicon.

As is further shown in FIG. 5, a gate mask 306 has been deposited and patterned to expose portions of tantalum 302 and tantalum nitride 303. The continuous blanket metal film composed of Ta 302 and TaN$_x$ 303 is then patterned with conventional photolithography operations to produce the gate electrodes. Typically, the continuous blanket metal film composed of Ta 302 and TaN$_x$ 303 is etched by reactive ion etching (RIE) with chlorine and an argon carrier gas. Chlorine ($Cl_2$) and a carbon source such as carbon tetrachloride ($CCl_4$) can be used in such a reactive ion etching operation. Those skilled in the art and having the benefit of this disclosure will appreciate that this metal layer may be patterned so as to form signal interconnect lines in addition to gate electrodes.

Figure 6:
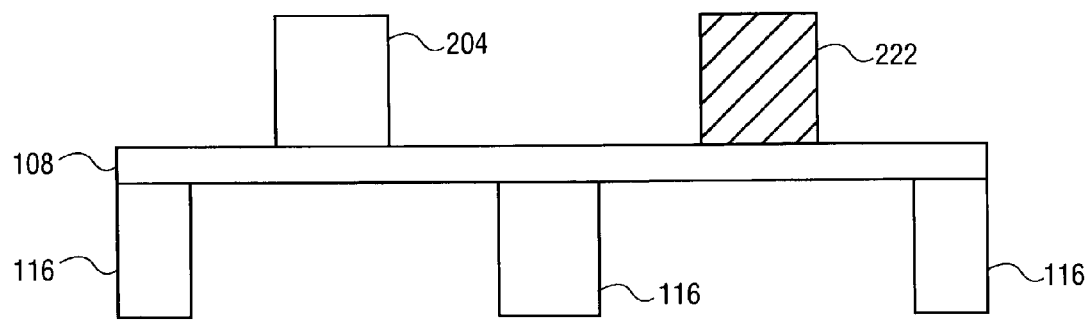
FIG. 6 is a schematic cross-sectional view of the wafer of FIG. 5, wherein the exposed portions of the tantalum and tantalum nitride films have been etched and the gate mask has been removed.

FIG. 6 shows that the exposed portions of tantalum 302 and tantalum nitride 303 films have been etched and gate mask 306 has been removed. After the gate pattern is established, source/drain junctions, aligned to the gate electrodes are formed. In the illustrative embodiment sidewall spacers are formed prior to the formation of the source/drain junctions. The source/drain implants are formed by ion implantation. Conventional operations such as annealing, spacer formation, ion implantation for junction formation and threshold voltage control are known in the art. The completed transistor structures with complementary tantalum and tantalum nitride gates are as shown in FIG. 2.

Various other layers of insulators and conducting material are formed above the gate level, as is well understood in the field of semiconductor manufacturing and integrated circuit design.

CONCLUSION

Embodiments of the present invention provide complementary metal gate electrodes for n-channel and p-channel FETs. Gate electrodes formed from metal do not experience the carrier depletion effects found in semiconductive gate electrodes such as doped polysilicon.

An advantage of embodiments of the present invention is the substantial elimination of transistor performance limitations caused by carrier depletion in the gate electrode.

The present invention may be implemented with various changes and substitutions to the illustrated embodiments. For example, the blanket layer of Ta may be patterned according to the gate mask of a particular integrated circuit, and then masked so that the gates of p-channel FETs can be converted to TaN$_x$.

It will be readily understood by those skilled in the art and having the benefit of this disclosure, that various other changes in the details, materials, and arrangements of the materials and steps which have been described and illustrated in order to explain the nature of this invention may be made without departing from the principles and scope of the invention as expressed in the subjoined Claims.

What is claimed is:

1. A method of making complementary FETs, comprising:
   forming a first doped region of a first conductivity type in a substrate;
   forming a second doped region of a second conductivity type in the substrate;
   forming a gate insulator layer over the first and second doped regions;
   depositing a conductive barrier layer on the gate insulator layer to protect the gate insulator layer;
   depositing a layer of a first metal over the barrier layer, the first metal having a first work function;

modifying a portion of the layer of the first metal such that the modified portion has a second work function;
after the modifying, forming a layer of copper over the first layer of the first metal, including over the modified portion of the layer of the first metal;
patterning the layer of copper over the layer of the first metal including the modified portion, to form gate electrodes, wherein the layer of copper is to further reduce sheet resistance of the gate electrodes; and
forming source/drain junctions aligned to the gate electrodes, wherein the depositing the conductive barrier layer is performed to a thickness less than 5 nm to keep the work functions of the gate electrodes over respective portions of the layer of the first metal intact.

2. The method of claim 1, wherein depositing the layer of the first metal comprises depositing a layer of tantalum.

3. The method of claim 2, wherein chemically changing the work function comprises nitridizing the first portion.

4. The method of claim 3, wherein nitridizing comprises exposing tantalum to a nitrogen ambient at high temperature.

5. The method of claim 3, wherein nitridizing comprises implanting nitrogen into tantalum.

6. The method of claim 3, wherein nitridizing comprises exposing tantalum to a plasma containing nitrogen.

7. The method of claim 2, wherein modifying a portion of the layer of the first metal comprises converting a portion of the layer of the first metal to tantalum nitride.

8. The method of claim 1, wherein modifying a portion of the layer of the first metal comprises:
forming a masking layer over the layer of the first metal;
patterning the masking layer such that at least a first portion of the first metal is exposed and a second portion is covered by the masking layer, the first portion being superjacent the second doped region; and
chemically changing the work function of the first portion.

9. The method of claim 1, wherein the conductive barrier layer comprises tantalum.

10. The method of claim 9, wherein the conductive barrier layer comprises less than 65 atomic per cent of nitrogen.

11. The method of claim 1, wherein the conductive barrier layer is a titanium nitride layer.

12. A method of making complementary FETs, comprising:
forming a first doped region of a first conductivity type in a substrate;
forming a second doped region of a second conductivity type in the substrate;
forming a gate insulator layer over the first and second doped regions;
depositing a barrier layer on the gate insulator layer to protect the gate insulator layer;
depositing a layer of a first metal over the barrier layer, the layer of the first metal having a first work function;
patterning the layer of the first metal to form a first gate electrode and a second gate electrode;
after the patterning the layer of the first metal, nitridizing the second gate electrode such that the second gate electrode has a second work function;
after the nitridizing, forming a layer of copper over the layer of the first metal, including over the nitridized portion of the layer of the first metal, wherein the forming the layer of copper is to further reduce sheet resistance of the first gate electrode and the second gate electrode; and
forming source/drain junctions aligned to the first gate electrode and the second gate electrode.

13. A method of making complementary FETs, comprising:
forming a gate insulator layer over a first doped region of a first conductivity type and a second doped region of a second conductivity type;
depositing a conductive barrier layer on the gate insulator layer to protect the gate insulator layer;
depositing a layer of a first metal over the barrier layer, the layer of the first metal having a first work function;
patterning the layer of the first metal to form a first gate electrode and a second gate electrode;
after the patterning the layer of the first metal, nitridizing a portion of the layer of the first metal such that the second gate electrode has a second work function;
after the nitridizing, forming a layer of copper over the layer of the first metal, including over the nitridized portion of the layer of the first metal, wherein the forming the layer of copper is to further reduce sheet resistance of the first gate electrode and the second gate electrode; and
forming source/drain junctions aligned to the first gate electrode and the second gate electrode, wherein the depositing the conductive barrier layer is performed to a thickness less than 5 nm to keep respective work functions of the first gate electrode and the second gate electrode intact.

14. The method of claim 13, wherein depositing the layer of the first metal comprises depositing a layer of tantalum.

15. The method of claim 13, further comprising:
forming a masking layer over the layer of the first metal;
patterning the masking layer such that at least a first portion of the layer of the first metal is exposed and a second portion is covered by the masking layer, the first portion being superjacent the second doped region.

16. The method of claim 13, wherein nitridizing a portion of the layer of the first metal comprises converting a portion of the layer of the first metal to tantalum nitride.

17. The method of claim 13, wherein the nitridizing comprises exposing tantalum to a nitrogen ambient at high temperature.

18. The method of claim 13, wherein the nitridizing comprises implanting nitrogen into tantalum.

19. The method of claim 13, wherein the nitridizing comprises exposing tantalum to a plasma containing nitrogen.

20. A method of making complementary FETs, comprising:
forming a gate insulator layer over a first doped region of a first conductivity type and a second doped region of a second conductivity type;
depositing a layer of a first metal over the gate insulator layer, the first metal having a first work function;
patterning the layer of the first metal to form a first gate electrode and a second gate electrode;
after the patterning the layer of the first metal, modifying the second gate electrode such that the second gate electrode has a second work function;
after the modifying, forming a layer of copper over the first gate electrode and second gate electrode, wherein the forming the layer of copper is to further reduce sheet resistance of the first gate electrode and the second gate electrode; and
after the modifying, forming source/drain junctions aligned to the first gate electrode and the second gate electrode.

21. The method of claim 20, further comprising depositing a barrier layer superjacent the gate insulator layer prior to depositing the layer of the first metal.

22. A method of making complementary FETs, comprising:
- forming a first doped region of a first conductivity type in a substrate;
- forming a second doped region of a second conductivity type in the substrate;
- forming a gate insulator layer over the first and second doped regions;
- depositing a conductive barrier layer on the gate insulator layer to protect the gate insulator layer, wherein the conductive barrier layer on the gate insulator layer provides a baffler for the copper;
- depositing a layer of a first metal over the baffler layer, the first metal having a first work function;
- modifying a portion of the layer of the first metal such that the modified portion has a second work function;
- after the modifying, forming a layer of copper over the first layer of the first metal, including over the modified portion of the layer of the first metal;
- patterning the layer of copper over the layer of the first metal including the modified portion, to form gate electrodes, wherein the layer of copper is to further reduce sheet resistance of the gate electrodes; and
- forming source/drain junctions aligned to the gate electrodes, wherein the depositing the conductive baffler layer is performed to a thickness less than 5 nm to keep the work functions of the gate electrodes over respective portions of the layer of the first metal intact.

* * * * *

UNITED STATES PATENT AND TRADEMARK OFFICE
CERTIFICATE OF CORRECTION

PATENT NO. : 7,022,559 B2  Page 1 of 1
APPLICATION NO. : 10/301285
DATED : April 4, 2006
INVENTOR(S) : Barnak et al.

It is certified that error appears in the above-identified patent and that said Letters Patent is hereby corrected as shown below:

In column 9, at line 15, delete "baffler" and insert --barrier--.

In column 9, at line 16, delete "baffler" and insert --barrier--.

In column 10, at line 11, delete "baffler" and insert --barrier--.

Signed and Sealed this

Eleventh Day of July, 2006

JON W. DUDAS
*Director of the United States Patent and Trademark Office*